(12) United States Patent
Kim (10) Patent No.: US 9,340,876 B2
(45) Date of Patent: May 17, 2016

(54) MASK FOR DEPOSITION PROCESS (71) Applicant: Applied Materials, Inc., Santa Clara, CA (US)

(72) Inventor: Kyung-Tae Kim, Suwon (KR)

(73) Assignee: APPLIED MATERIALS, INC., Santa Clara, CA (US)

( * ) Notice: Subject to any disclaimer, the term of this patent is extended or adjusted under 35 U.S.C. 154(b) by 330 days.

(21) Appl. No.: 14/062,578

(22) Filed: Oct. 24, 2013

(65) Prior Publication Data

US 2014/0158046 A1 Jun. 12, 2014

Related U.S. Application Data (60) Provisional application No. 61/736,416, filed on Dec. 12, 2012.

(51) Int. Cl.
*H01L 51/56* (2006.01)
*C23C 16/458* (2006.01)
*C23C 16/04* (2006.01)
*H01L 51/00* (2006.01)
*H01L 51/52* (2006.01)

(52) U.S. Cl.
CPC ............ *C23C 16/4585* (2013.01); *C23C 16/042* (2013.01); *H01L 51/0011* (2013.01); *H01L 51/5253* (2013.01)

(58) Field of Classification Search
None
See application file for complete search history.

(56) References Cited

U.S. PATENT DOCUMENTS

| | | | |
|---|---|---|---|
| 7,504,332 B2 | 3/2009 | Won et al. | |
| 2002/0086153 A1* | 7/2002 | O'Donnell | C23C 14/083 428/336 |
| 2003/0194293 A1* | 10/2003 | Johnson | F16B 41/002 411/353 |
| 2004/0123799 A1* | 7/2004 | Clark | C23C 14/042 118/504 |
| 2005/0239294 A1 | 10/2005 | Rosenblum et al. | |
| 2005/0266174 A1* | 12/2005 | Hou | C23C 16/4585 427/569 |
| 2006/0011137 A1* | 1/2006 | Keller | C23C 16/042 118/720 |
| 2007/0184745 A1* | 8/2007 | Griffin | C23C 14/042 445/24 |
| 2008/0145521 A1* | 6/2008 | Guo | C23C 14/042 427/75 |
| 2012/0208306 A1 | 8/2012 | Haas et al. | |
| 2012/0237682 A1 | 9/2012 | Hong et al. | |
| 2013/0040047 A1* | 2/2013 | Karaki | C23C 14/042 427/66 |
| 2013/0203193 A1 | 8/2013 | Kang et al. | |

* cited by examiner

*Primary Examiner* — Charles Capozzi
(74) *Attorney, Agent, or Firm* — Patterson & Sheridan, LLP (57) ABSTRACT

Embodiments of the invention provide a mask for use in a deposition process. In one embodiment, the mask comprises a rectangular frame member having two opposing major sides and two opposing minor sides, each of the major and minor sides comprising a first side, a second side opposing the first side and joined to the first side by a first outer sidewall, a second outer sidewall disposed inward of the first outer sidewall and defining a raised region projecting from a plane of the second side, and an interior sidewall joining the raised region and the first side. The mask also comprises a rectangular strip disposed on a surface of the raised region, the rectangular strip comprising a first end, and a second end coupled to the first end and extending into an interior area of the frame member.

20 Claims, 6 Drawing Sheets

MASK FOR DEPOSITION PROCESS

CROSS-REFERENCE TO RELATED APPLICATION

This application claims benefit of U.S. Provisional Patent Application Ser. No. 61/736,416, filed Dec. 12, 2012, which is hereby incorporated by reference herein.

BACKGROUND

1. Field of the Invention

Embodiments of the invention relate to a mask for use in a deposition process, such as a chemical vapor deposition (CVD) process used in the manufacture of electronic devices. In particular, embodiments of the invention relate to a mask utilized in an encapsulation process in the manufacture of organic light emitting diode (OLED) display devices.

2. Description of the Related Art

OLEDs are used in the manufacture of television screens, computer monitors, mobile phones, other hand-held devices, etc. for displaying information. A typical OLED may include layers of organic material situated between two electrodes that are all deposited on a substrate in a manner to form a matrix display panel having individually energizable pixels. The OLED is generally placed between two glass panels, and the edges of the glass panels are sealed to encapsulate the OLED therein.

There are many challenges encountered in the manufacture of such display devices. In some fabrication steps, the OLED material is encapsulated in one or more layers to prevent moisture from damaging the OLED material. During these processes, one or more masks are utilized to shield portions of the substrate that do not include the OLED material. The masks used in these processes must endure significant temperature differences. The temperature extremes cause thermal expansion and contraction of the mask, which may lead to cracks, bending or breakage of the mask, any one of which may cause contamination of portions of the substrate. Additionally, significant electrostatic discharge (ESD) may be present and/or created during these deposition processes. Uncontrolled ESD may damage the OLED material.

Therefore, there is a continuous need for new and improved apparatus and processing methods using masks in forming OLED display devices.

SUMMARY

Embodiments of the invention provide a mask and a process kit for use in a deposition process. In one embodiment, a mask for use in a deposition process is provided The mask comprises a rectangular frame member having two opposing major sides and two opposing minor sides, each of the major and minor sides comprising a first side, a second side opposing the first side and joined to the first side by a first outer sidewall, a second outer sidewall disposed inward of the first outer sidewall and defining a raised region projecting from a plane of the second side, and an interior sidewall joining the raised region and the first side. The mask also comprises a rectangular strip disposed on a surface of the raised region, the rectangular strip comprising a first end, and a second end coupled to the first end and extending into an interior area of the frame member.

In another embodiment, a mask for a deposition process is provided. The mask comprises a rectangular frame member having two opposing major sides and two opposing minor sides. Each of the major and minor sides comprise a first side, a second side opposing the first side and joined to the first side by a first outer sidewall, a second outer sidewall disposed inward of the first outer sidewall and defining a raised region projecting from a plane of the second side, and an interior sidewall joining the raised region and the first side. The mask also comprises a rectangular strip disposed on a surface of the raised region, the rectangular strip coupled to the frame member by a fastener assembly and circumscribing an interior surface of the frame member. The rectangular strip comprises a first end, and a second end coupled to the first end and extending past the interior sidewall into an interior area of the frame member.

In another embodiment, a process kit for use in a deposition chamber is provided. The process kit comprises a shadow frame, and a mask. The mask comprises a rectangular frame member having two opposing major sides and two opposing minor sides, each of the major and minor sides comprising a first side, a second side opposing the first side and joined to the first side by a first outer sidewall, a second outer sidewall disposed inward of the first outer sidewall and defining a raised region projecting from a plane of the second side, and an interior sidewall joining the raised region and the first side. The mask also comprises a rectangular strip disposed on a surface of the raised region, the rectangular strip comprising a first end, and a second end coupled to the first end and extending into an interior area of the frame member.

BRIEF DESCRIPTION OF THE DRAWINGS

So that the manner in which the above recited features can be understood in detail, a more particular description of embodiments of the invention, briefly summarized above, may be had by reference to the embodiments, some of which are illustrated in the appended drawings. It is to be noted, however, that the appended drawings illustrate only typical embodiments and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention include a mask for use in a deposition chamber for a CVD process, such as a CVD process chamber or a plasma-enhanced chemical vapor deposition (PECVD) process chamber that is operable to align the mask with respect to a substrate, position the mask on the substrate, and deposit an encapsulation layer on an OLED material formed on the substrate. The embodiments described herein may be used with other types of process chambers and are not limited to use with CVD or PECVD process chambers. The embodiments described herein may be used with other types of deposition processes and are not limited to use for encapsulating OLED's formed on substrates. The embodiments described herein may be used with various types, shapes, and sizes of masks and substrates.

Figure 1:
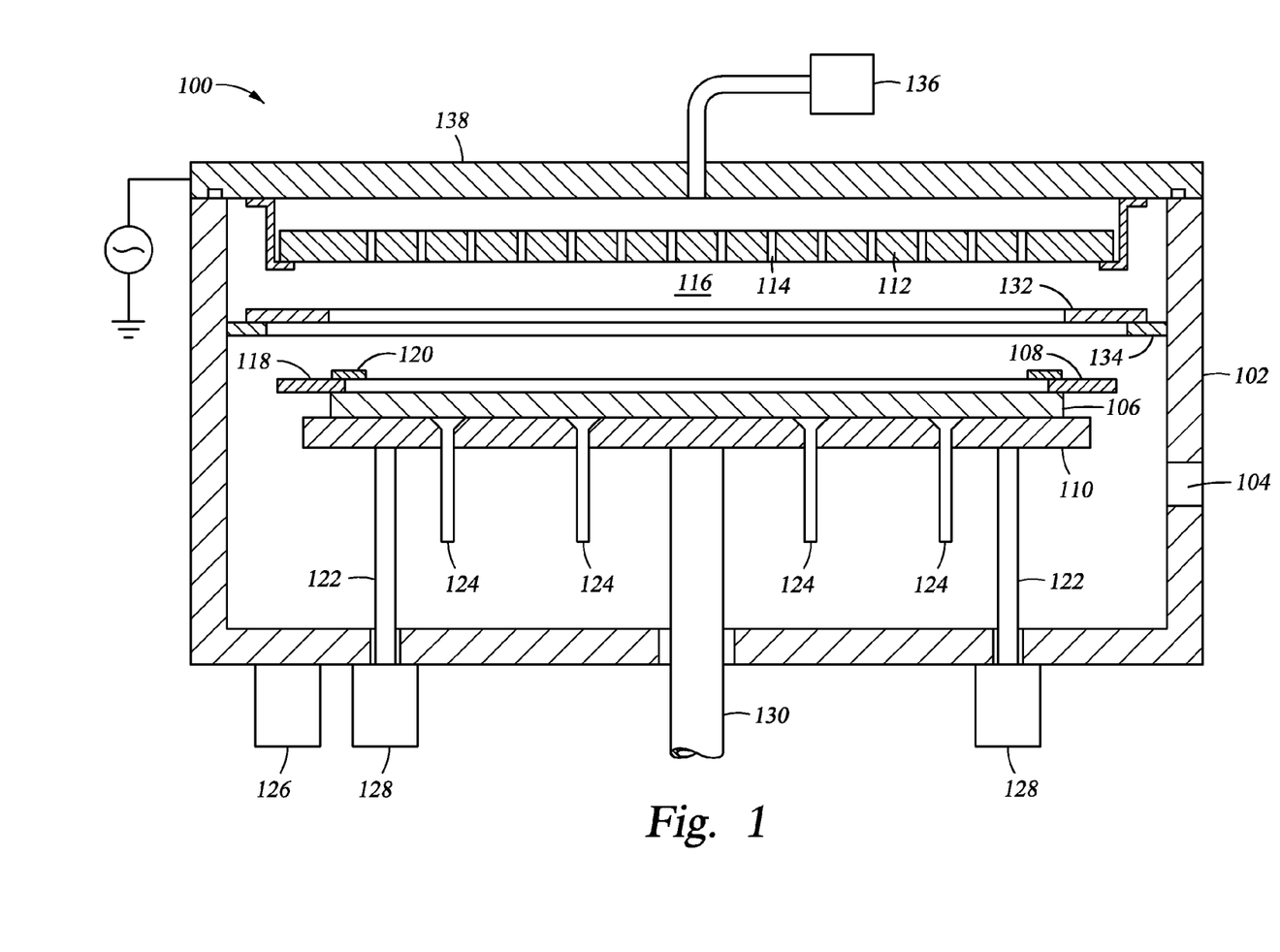
FIG. 1 is a schematic cross-sectional view of a CVD apparatus according to one embodiment.

FIG. 1 is a schematic cross-sectional view of a CVD apparatus 100 according to one embodiment. The CVD apparatus 100 includes a chamber body 102 having an opening 104 through one or more walls to permit one or more substrates 106 and a mask 108 to be inserted therein. The substrate 106, during processing, is disposed on a substrate support 110 opposite a diffuser 112 having one or more openings 114 formed therethrough to permit processing gas to enter a processing space 116 between the diffuser 112 and the substrate 106.

The substrate 106 may be used to form an OLED display where OLED(s) are formed on the surface of the substrate 106 by sequential deposition processes. The substrate 106 may be used to form a single display or multiple displays, and each display includes a plurality of OLEDs coupled to an electrical contact layer formed about a perimeter of each display. During manufacture, the OLED portion of each display is encapsulated in one or more layers comprising silicon nitride, aluminum oxide, and/or a polymer to protect the OLEDs from the environment. The encapsulation material may be deposited by CVD and the mask 108 is used to shield the electrical contact layer during deposition of the encapsulation material. The mask 108 includes a frame 118 and a strip 120 protruding inwardly from the frame 118 that shields the electrical contact layer during CVD processes.

For processing, the mask 108 is initially inserted into the apparatus 100 through the opening 104 and disposed upon multiple motion alignment elements 122. The substrate 106 is then inserted though the opening 104 and disposed upon multiple lift pins 124 that extend through the substrate support 110. The substrate support 110 then raises to meet the substrate 106 so that the substrate 106 is disposed on the substrate support 110. The substrate 106 is aligned while on the substrate support 110.

Once the substrate 106 is aligned on the substrate support 110, one or more visualization systems 126 determine whether the mask 108 is properly aligned over the substrate 106. If the mask 108 is not properly aligned, then one or more actuators 128 move one or more motion alignment elements 122 to adjust the location of the mask 108. The one or more visualization systems 126 then recheck the alignment of the mask 108.

Once the mask 108 is properly aligned over the substrate 106, the mask 108 is lowered onto the substrate 106, and then the substrate support 110 raises on a stem 130 until a shadow frame 132 contacts the mask 108. The shadow frame 132, prior to resting on the mask 108, is disposed in the chamber body 102 on a ledge 134 that extends from one or more interior walls of the chamber body 102. The substrate support 110 continues to rise until the substrate 106, mask 108 and shadow frame 132 are disposed in the processing position opposite the diffuser 112. Processing gas is then delivered from one or more gas sources 136 through an opening formed in a backing plate 138 while an electrical bias is provided to the diffuser 112 to form a plasma in the processing space 116 between the diffuser 112 and the substrate 106. Temperatures during processing may be about 80 degrees Celsius (° C.) to about 100° C., or greater.

Figure 2:
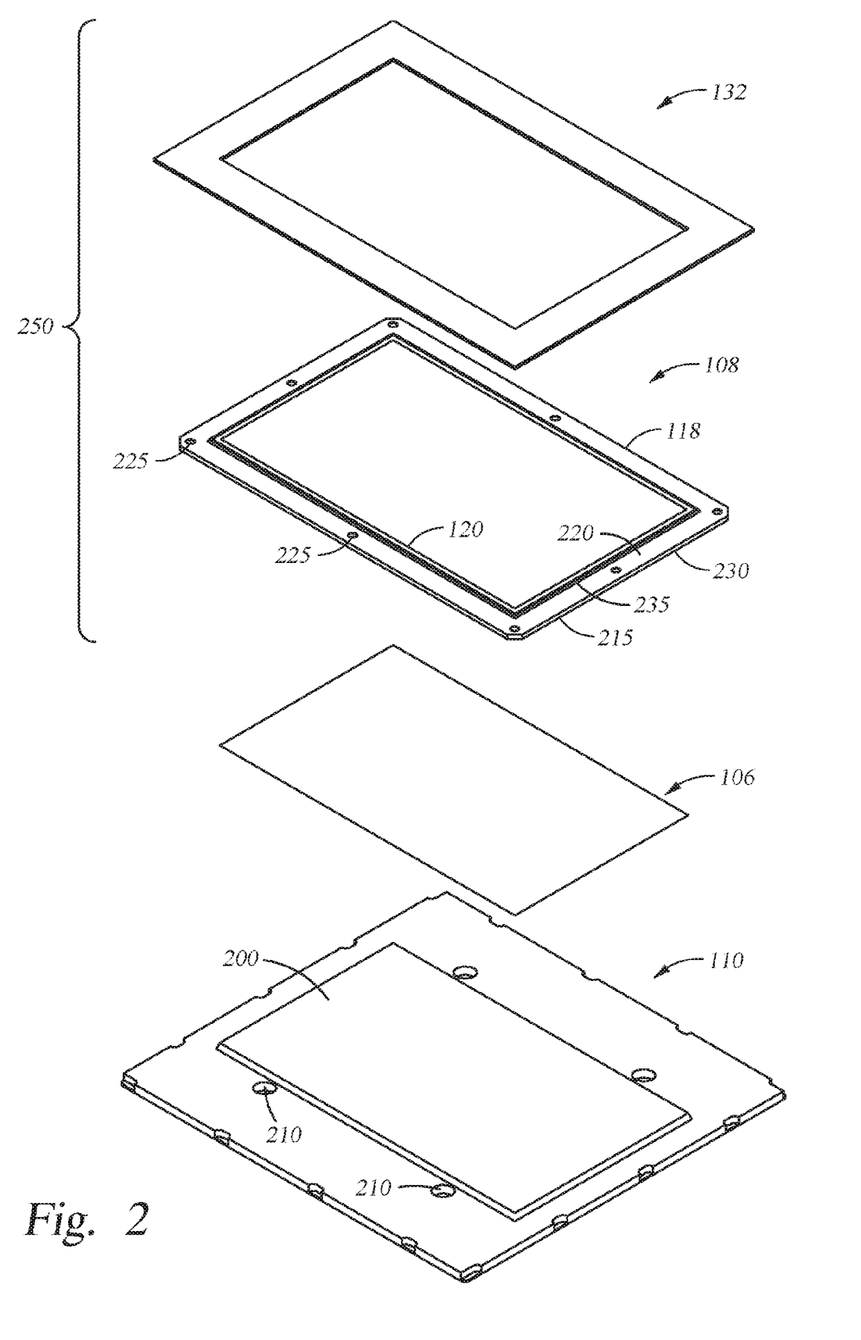
FIG. 2 is an exploded isometric view of interior chamber components used in the chamber body of the apparatus of FIG. 1.

FIG. 2 is an exploded isometric view of interior chamber components used in the chamber body 102 of the CVD apparatus 100 of FIG. 1. In FIG. 2, the substrate 106 rests on a substrate receiving surface 200 of the substrate support 110 during processing. The substrate support 110 is typically fabricated from an aluminum material. The substrate 106 is at least partially overlaid by the mask 108 and the shadow frame 132 at least partially overlies the mask 108. The shadow frame 132 is typically fabricated from an aluminum material. The mask 108 and the shadow frame 132 may include dimensions of greater than about 0.5 meters (m) in length by 0.5 m in width. Openings 210 are shown in the substrate support 110 for access of the one or more motion alignment elements 122 to extend therethrough and contact and/or move the mask 108 relative to the substrate 106 to ensure proper alignment therebetween. The mask 108 and the shadow frame 132 may be referred to as a process kit 250.

The mask 108 includes the frame 118 that is rectangular in shape, having two opposing major side members and two opposing minor side members. The frame 118 may be made from multiple pieces and joined or integrally formed from a material such as a metallic or a ceramic material. The frame 118 may be formed from a material having a low coefficient of thermal expansion (CTE), such as a material having a CTE of less than about $18 \times 10^{-6}$/° C. The frame 118 may be formed from a material having a CTE of about $7.8 \times 10^{-6}$/° C. or less, for example $7.5 \times 10^{-6}$/° C. or less, for example, $6 \times 10^{-6}$/° C. or less, for example $4.4 \times 10^{-6}$/° C., or less, such as $2.6 \times 10^{-6}$/° C., or less, for example, about $1.2 \times 10^{-6}$/° C. Examples of the materials for the frame 118 include stainless steel, nickel (Ni), iron (Fe), cobalt (Co), combinations thereof and alloys thereof, as well as ceramics. Examples of metallic alloys include KOVAR® alloys (Ni—Co) and INVAR® alloys (Ni—Fe). The frame 118 may be made of a ceramic material due to the low CTE as well as desirable dielectric properties that will reduce electrostatic discharge (ESD) generation and/or electron flow, as compared to metallic materials. Examples of ceramic materials include alumina (aluminum oxide ($Al_2O_3$)), zirconia (zirconium oxide ($ZrO_2$)), silicon carbide (SiC), and silicon nitride ($Si_3N_4$). The ceramic materials may be coated with another ceramic material. The ceramic material used in the frame 118 should minimize or eliminate static discharge or electrical charge accumulation between the frame 118 and other components in contact with the frame 118.

The frame 118 also includes a first side 215 on a lower surface thereof and a second side 220 opposing the first side 215. The second side 220 may comprise a plurality of depressions 225 that mate with projections (not shown) on a lower surface of the shadow frame 132, that facilitates indexing and alignment of the shadow frame 132 with the mask 108. The first side 215 is joined with the second side 220 by a first outer sidewall 230. The frame 118 also includes a raised region 235 projecting from a plane of the second side 220. The strip 120 is coupled to an upper surface of the raised region 235. The strip 120 may be a substantially planar rectangular member that is fastened to the frame 118. The strip 120 projects inwardly from the raised region 235 in a plane that is substantially parallel with a plane of one or both of the first side 215 and the second side 220.

Figure 3A:
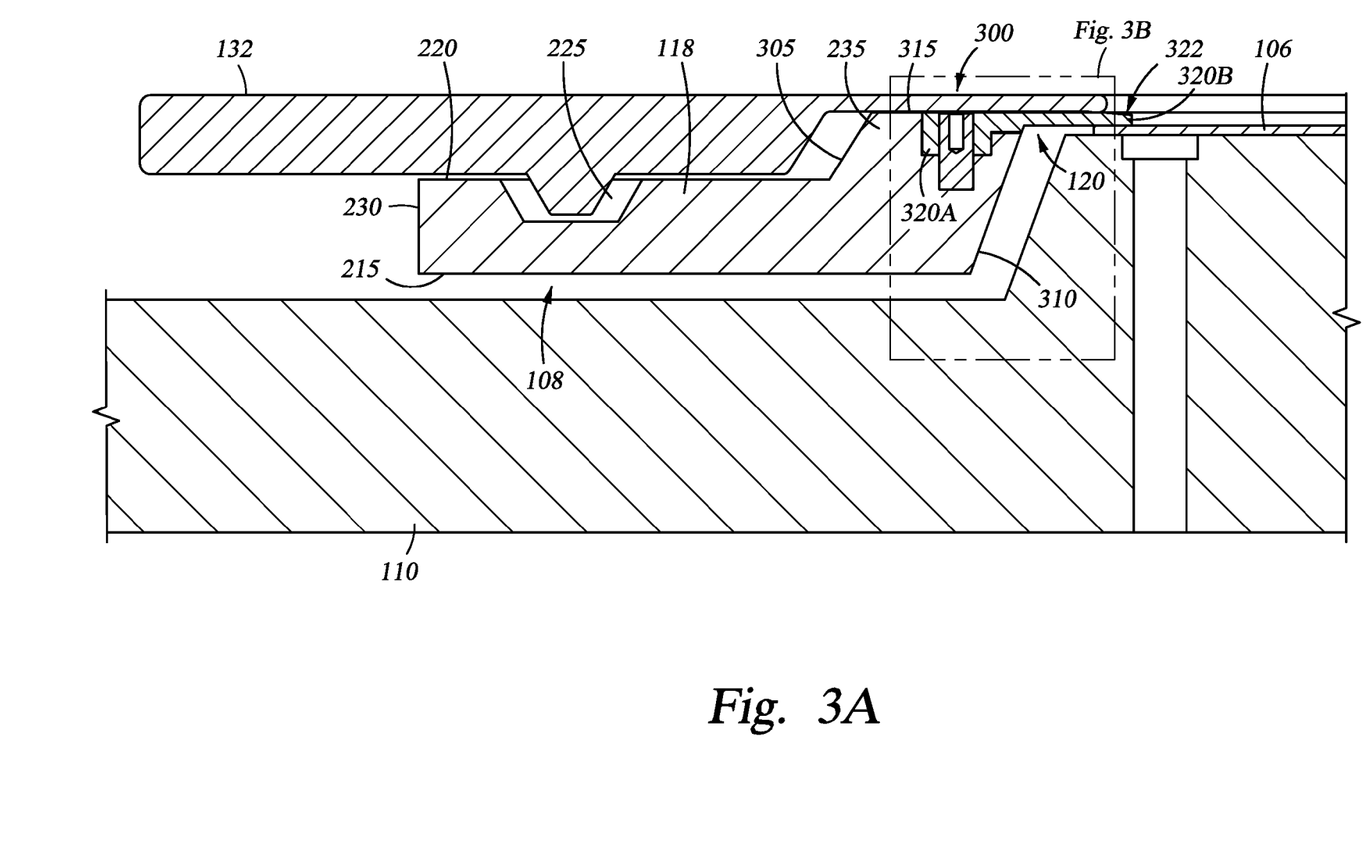
FIG. 3A is a side cross-sectional view of the substrate support of FIG. 1 having the substrate thereon in a processing position.

FIG. 3A is a side cross-sectional view of the substrate support 110 of FIG. 1 having the substrate 106 thereon in a processing position. During processing, a perimeter of the substrate 106 is shielded by the strip 120, and a portion of the frame 118 is shielded by the shadow frame 132. As shown in FIG. 3A, the frame 118 includes the raised region 235 that is coupled to the strip 120 by a fastener assembly 300. The fastener assembly 300 indexes and fixes the strip 120 to the frame 118. The raised region 235 extends from a plane of the second side 220 and is joined to the second side 220 by a second outer sidewall 305. An interior sidewall 310 joins the first side 215 with a support surface 315 of the raised region 235. In some embodiments, one or both of the second outer sidewall 305 and the interior sidewall 310 are sloped at an obtuse angle relative to a plane of the first side 215 or the second side 220. The strip 120 includes a first end 320A coupled to the body of the frame 118 and a second end 320B extending therefrom. In one embodiment, the second end 320B may include a bevel 322 that tapers from a planar upper surface of the strip 120 to an extreme end of the second end 320B.

Figure 3B:
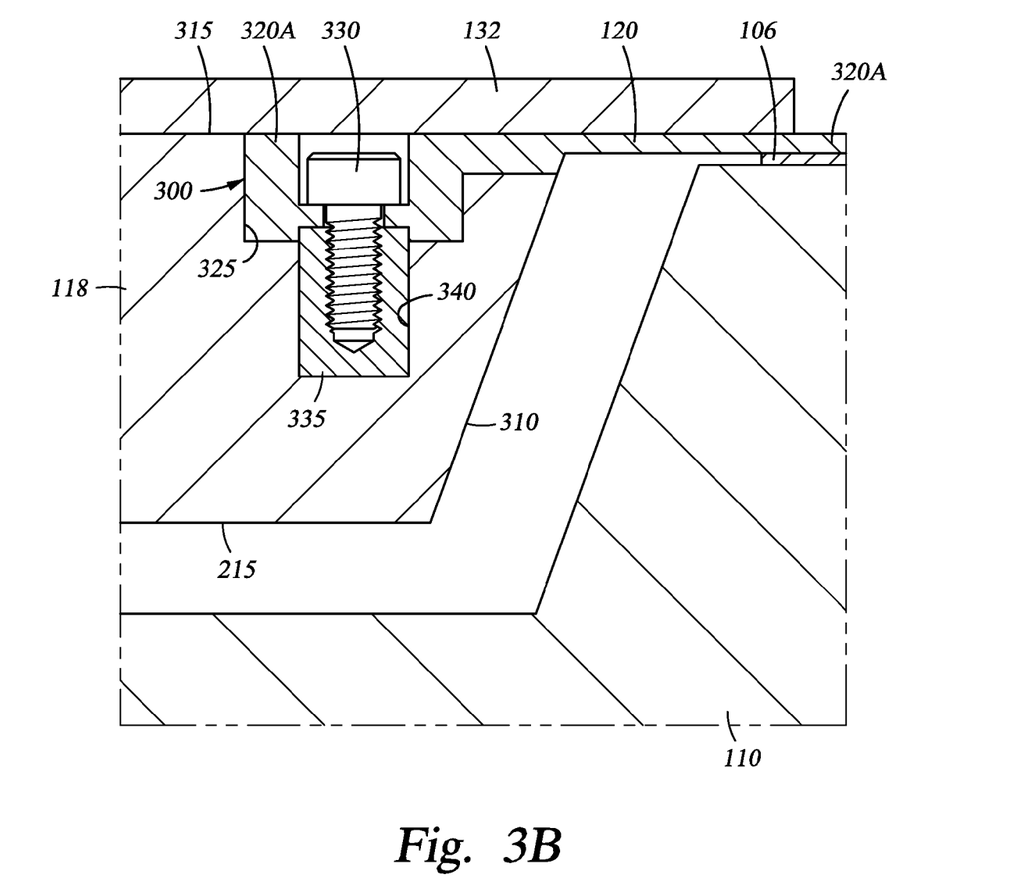
FIG. 3B is an enlarged cross-sectional view of a portion of the frame of the mask of FIG. 3A.

FIG. 3B is an enlarged cross-sectional view of a portion of the frame 118 of the mask 108 of FIG. 3A, as well as a portion of the substrate support 110 and the shadow frame 132. The strip 120 includes the first end 320A disposed laterally from the second end 320B. The first end 320A is fastened to the support surface 315 of the raised region 235. FIG. 3B also shows one embodiment of a fastener assembly 300. The fastener assembly 300 is used to couple the first end 320A of the strip 120 to the frame 118 that allows the second end 320B of the strip 120 to extend away from the frame 118 in a cantilevered manner. The second end 320B includes a smaller cross-sectional dimension (thickness) that the cross-sectional dimension of the first end 320A. In some embodiments, the thickness of the first end 320A is about 2 times the thickness of the second end 320B. In one example, the thickness of the second end 320B is about 3.0 millimeters (mm) to about 4.0 mm, such as about 3.5 mm, while the thickness of the first end 320A is about 6.0 mm, or greater. In this embodiment, the first end 320A of the strip 120 comprises a rectangular cross-section, having one or more substantially square corners, which is disposed in a channel 325 formed in the support surface 315 of the raised region 235.

The strip 120 may be made from multiple pieces and suitably joined or integrally formed as a single member from a ceramic material. The strip 120 may be formed from a material having a CTE that is near or substantially equal to the CTE of the frame 118. A ceramic material also includes dielectric properties, which minimize ESD generation and/or electron flow to or from adjacent components, as compared to metallic materials. The ceramic material used in the strip 120 will minimize or eliminate static discharge or electrical charge accumulation between the strip 120 and other components in contact with the strip 120. Examples of ceramic materials for the strip 120 include alumina, silicon carbide, zirconia, and silicon nitride. The frame 118 may be formed from a material having a CTE of about $7.8 \times 10^{-6}/°$ C. or less, for example $7.1 \times 10^{-6}/°$ C. or less, such as $4.4 \times 10^{-6}/°$ C. or less, for example $2.6 \times 10^{-6}/°$ C., or less. The ceramic material may further be coated with another ceramic material.

The fastener assembly 300 includes a fastener 330 disposed in an opening formed in the first end 320A of the strip 120. The fastener 330 may be a bolt or screw that is threaded into the frame 118. Alternatively, an indexing member 335, which may be a pin or a dowel, may be included in the fastener assembly 300. The indexing member 335 may be disposed in a blind hole 340 formed in the frame 118. The indexing member 335 may include a shoulder region that interfaces with the first end 320A of the strip 120 to facilitate alignment therebetween. The fastener 330 may be coupled to the indexing member 335 as shown to fix the strip 120 relative to the frame 118. In embodiments where the indexing member 335 is not used, the fastener 330 may be coupled directly to a blind hole in the frame 118. The fastener assembly 300 may be made of ceramic materials similar to the ceramic materials used for the frame 118 or the strip 120.

Figure 4A:
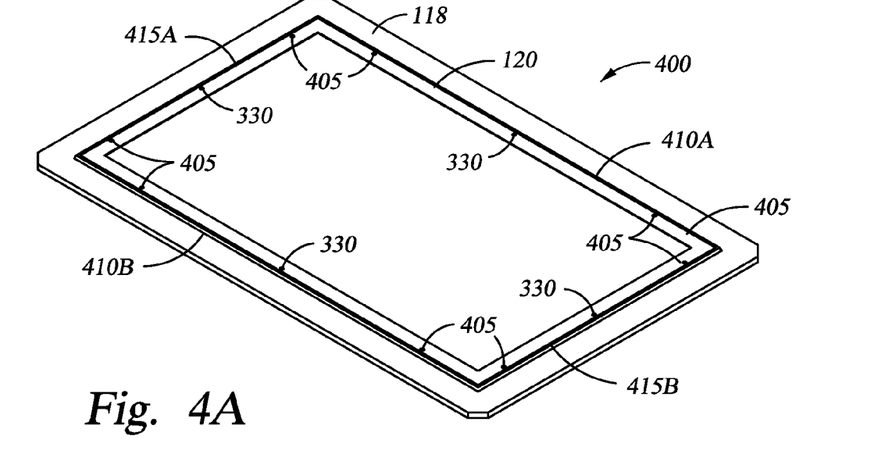
FIG. 4A is an isometric view of one embodiment of a mask that may be used in the apparatus of FIG. 1.

FIG. 4A is an isometric view of one embodiment of a mask 400 that may be used in the apparatus 100 of FIG. 1. The mask 400 includes a frame 118 and a strip 120 circumscribing an inner edge of the frame 118. Four fasteners 330 are shown coupling the strip 120 to the frame 118. Each fastener 330 may be a portion of the fastener assembly 300 shown in FIG. 3A and FIG. 3B. Alternatively or additionally, one or more fasteners 405 may be used to couple the strip 120 to the frame 118. The fasteners 405 may be a simple screw that is threaded into a blind hole formed in the frame 118.

In one embodiment, one fastener 330 is disposed centrally along the length of each side portion 410A, 410B, 415A, and 415B of the strip 120. The fasteners 330 may include an indexing member 335 while the fasteners 405 may be coupled directly to the frame 118. In one embodiment, the fasteners 330 located centrally on each side portion 410A, 410B, 415A, and 415B of the strip 120 may be coupled with a respective fastener assembly 300 (shown in FIG. 3B) disposed centrally along the length of each side of the frame 118. Locating the fastener 330 (and fastener assembly 300) at midpoints in the length direction of the respective components minimizes or eliminates any thermal expansion effects acting on the fasteners 330 and the fastener assembly 300. This provides ease in assembly of the strip 120 to the frame 118 and may minimize stresses acting on the fastener 330 and the fastener assembly 330. The midpoint position of the fasteners 330 and the fastener assemblies 300 also allow tighter machining tolerances when forming the blind holes 340 (shown in FIG. 3B). In one embodiment, the tolerance between blind holes 340 is about 0.01 mm. While the fasteners 330 may be used for indexing as well as fixing the strip 120 to the frame 118, the fasteners 405 may be used to fix the strip 120 to the frame 118 and eliminate any gaps between the strip 120 and the frame 118. Each of the fasteners 330 and 405 may include a slotted head, a Phillips head, a hex or Allen head, and combinations thereof. The head of the fasteners 330 and 405 are typically recessed below a plane of the upper surface of the strip 120 so there is no contact or interference between the fasteners 330 and 405 and the shadow frame 132 (shown in FIG. 3B). As the head of the fasteners 330 and 405 are shielded from deposition by the shadow frame 132 during processing, the heads of the fasteners 330 and 405 remain free of deposition.

Figure 4B:
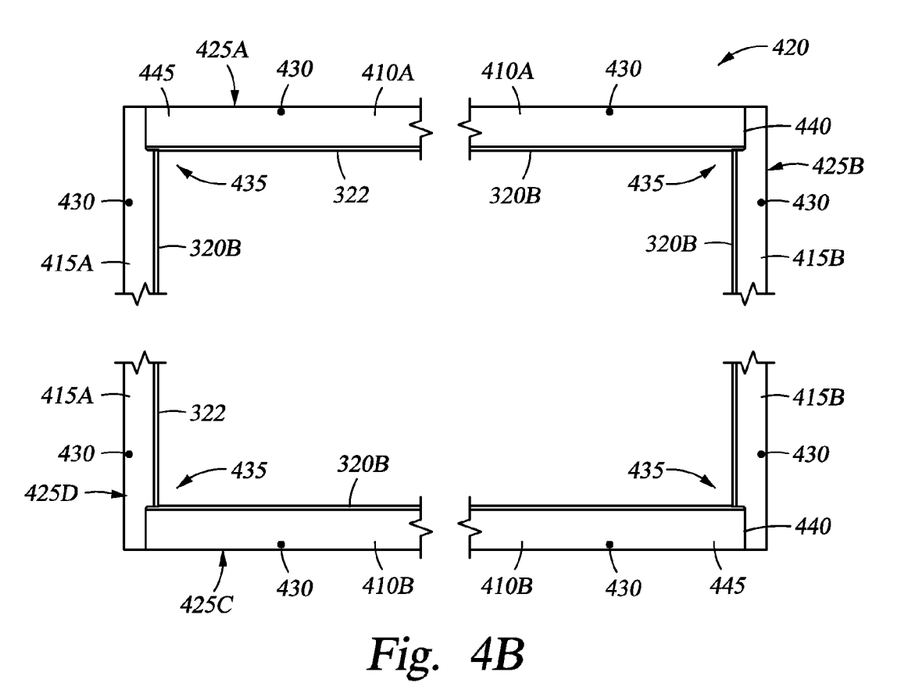
FIG. 4B is a schematic top view showing one embodiment of a strip assembly that may be used with embodiments of the mask as described herein.

FIG. 4B is a schematic top view showing one embodiment of a strip assembly 420 having multiple side portions. The strip assembly 420 includes a first major side strip 425A, a second major side strip 425C, a first minor side strip 425B and a second minor side strip 425D. Each of the strips 425A-425D may be constructed similarly to the strip 120 in all respects except for the detachable corners 435. Openings 430 are shown on the first end 320A of each strip 425A-425D for receiving a fastener 330 or 405 (shown in FIG. 4A). In one embodiment, the corners 435 include a recessed portion 440 that interfaces with an end 445 of the strips 425A-425D. While the recessed portions 440 are shown on the ends of the first minor side strip 425B and the second minor side strip 425D, the ends of the first major side strip 425A and the second major side strip 425C may include a recessed portion.

Figure 5:
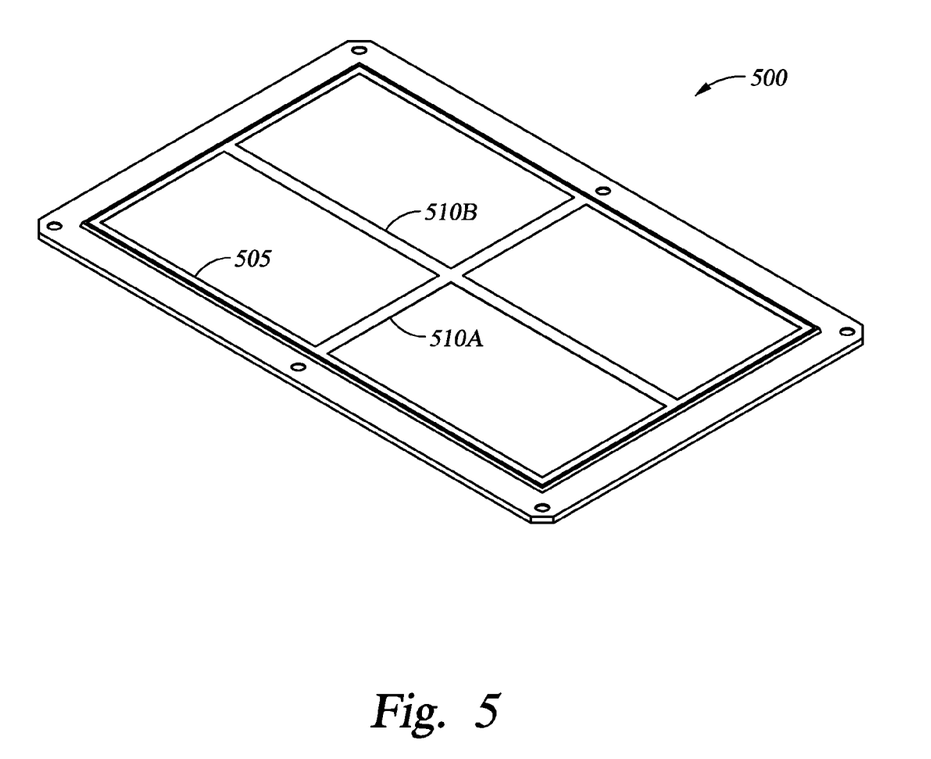
FIG. 5 is an isometric view of another embodiment of a mask that may be used in the apparatus of FIG. 1.

FIG. 5 is an isometric view of another embodiment of a mask 500 that may be used in the apparatus 100 of FIG. 1. The mask 500 includes a frame 118 and a strip 505 circumscribing an inner edge of the frame 118. The strip 505 may be similar to the strip 120 or include multiple side strips 425A-425D as shown in FIG. 4B. In addition, the mask 500 may include a first inner strip portion 510A and/or a second inner strip portion 510B. Use of one or both of the first inner strip portion 510A and the second inner strip portion 510B separates the interior area of the mask 500 into a screen mask, which provides at least two open areas for utilization in an encapsulation process. Providing the first inner strip portion 510A (or the second inner strip portion 510B) enables shielding of the contact regions of two OLED display screens during encapsulation processes. Using both of the first inner strip portion 510A and the second inner strip portion 510B enables shielding of the contact regions of four OLED display screens during encapsulation processes.

A mask for a deposition process is provided. The masks 108, 400 and 500 as described herein provide a longer lifetime, reduced production costs, minimization of ESD challenges, all of which minimize cost of ownership. Conventional materials for masks include metallic materials that are joined using advanced welding processes (e.g., electron beam welding). The modular aspect of the masks 108, 400 and 500 provide ease in assembly by personnel using the fastener assembly 300 that negates welding, which lowers production costs. The conventional metallic masks include a thin cross-sectional thickness, which makes the masks prone to bending. Using a ceramic material for at least the strip 120 makes the strip 120 more robust than conventional metallic strips. Additionally, using dielectric material also minimizes or eliminates ESD, which can severely damage OLED's.

While the foregoing is directed to embodiments of the invention, other and further embodiments of the invention may be devised without departing from the basic scope thereof, and the scope thereof is determined by the claims that follow.

The invention claimed is:

1. A mask for a deposition process, the mask comprising:
a rectangular frame member having two opposing major sides and two opposing minor sides, each of the major and minor sides comprising:
  a first side disposed in a plane;
  a second side opposing the first side, the second side disposed in a plane that is substantially parallel to the plane of the first side and joined to the first side by a first outer sidewall;
  a second outer sidewall disposed inward of the first outer sidewall and defining a raised region projecting from the plane of the second side, the raised region having a support surface that projects away from the second side and inwardly from the second outer sidewall; and
  an interior sidewall joining the support surface and the first side;
  a depression formed in the second side disposed outward of the support surface;
a rectangular strip disposed on the support surface of the raised region, the rectangular strip comprising:
  a first end; and
  a second end coupled to the first end and extending into an interior area of the frame member.

2. The mask of claim 1, wherein the frame member comprises a first material and the rectangular strip comprises a second material.

3. The mask of claim 2, wherein the first material and the second material are different.

4. The mask of claim 2, wherein the first material comprises an electrically conductive material and the second material comprises a dielectric material.

5. The mask of claim 1, further comprising:
a fastener assembly coupling the rectangular strip to the frame member.

6. The mask of claim 5, wherein the fastener assembly comprises an index pin pressed into an opening in the frame member and an opening in the rectangular strip.

7. The mask of claim 6, wherein the fastener assembly further comprises a fastener disposed in the index pin.

8. The mask of claim 5, wherein the frame member comprises a first material, and the rectangular strip and the fastener assembly comprises a second material.

9. The mask of claim 8, wherein the first material comprises an electrically conductive material and the second material comprises a dielectric material.

10. The mask of claim 9, wherein the second material comprises a ceramic material.

11. The mask of claim 9, wherein the first material comprises a material having a first coefficient of thermal expansion and the second material comprises a material having a second coefficient of thermal expansion that is substantially equal to the first coefficient of thermal expansion.

12. A mask for a deposition process, the mask comprising:
a rectangular frame member having two opposing major sides and two opposing minor sides, each of the major and minor sides comprising:
  a first side;
  a second side opposing the first side, the second side disposed in a first plane and joined to the first side by a first outer sidewall disposed in a second plane that is substantially normal to the first plane;
  a second outer sidewall disposed inward of the first outer sidewall and defining a raised region projecting above the first plane of the second side and having a support surface that projects inwardly from the second outer sidewall, the support surface being substantially parallel to the first plane; and
  an interior sidewall joining the support surface and the first side; and
a rectangular strip disposed on the support surface of the raised region, the rectangular strip coupled to the frame member by a fastener assembly and circumscribing an interior surface of the frame member, the rectangular strip comprising:
  a first end; and
  a second end coupled to the first end and extending past the interior sidewall into an interior area of the frame member.

13. The mask of claim 12, wherein the fastener assembly comprises an index pin pressed into an opening in the frame member and an opening in the rectangular strip.

14. The mask of claim 13, wherein the fastener assembly further comprises a fastener disposed in the index pin.

15. The mask of claim 14, wherein the frame member comprises a first material, and the rectangular strip and the fastener assembly comprises a second material.

16. The mask of claim 15 wherein the first material comprises an electrically conductive material and the second material comprises a dielectric material.

17. The mask of claim 16, wherein the second material comprises a ceramic material.

18. A process kit for use in a deposition chamber, the process kit comprising:
a shadow frame; and
a mask for supporting the shadow frame, the mask comprising:
  a rectangular frame member having two opposing major sides and two opposing minor sides, each of the major and minor sides comprising:

a first side;
a second side opposing the first side, the second side disposed in a first plane and joined to the first side by a first outer sidewall disposed in a second plane that is substantially normal to the first plane;
a second outer sidewall disposed inward of the first outer sidewall and defining a raised region projecting above the first plane of the second side; and
an interior sidewall joining a support surface of the raised region and the first side; and
a rectangular strip disposed on the support surface of the raised region disposed in a plane that is substantially parallel the first plane, the rectangular strip comprising:
a first end; and
a second end coupled to the first end and extending into an interior area of the frame member.

19. The process kit of claim 18, wherein the mask further comprises:
a fastener assembly coupling the rectangular strip to the frame member.

20. The process kit of claim 19, wherein the fastener assembly comprises an index pin pressed into an opening in the frame member and an opening in the rectangular strip.

* * * * *